(12) United States Patent
vom Stein

(10) Patent No.: US 12,153,081 B1
(45) Date of Patent: Nov. 26, 2024

(54) DEVICE AND METHOD FOR MONITORING A TURN-OFF CAPABILITY

(71) Applicant: Turck Holding GmbH, Halver (DE)

(72) Inventor: Johannes vom Stein, Hückeswagen (DE)

(73) Assignee: Turck Holding GmbH, Halver (DE)

( * ) Notice: Subject to any disclaimer, the term of this patent is extended or adjusted under 35 U.S.C. 154(b) by 0 days.

(21) Appl. No.: 18/748,409

(22) Filed: Jun. 20, 2024

(30) Foreign Application Priority Data

Jun. 22, 2023 (DE) ..................... 10 2023 116 488.0

(51) Int. Cl.
*G01R 19/25* (2006.01)
*G01R 15/04* (2006.01)
(Continued)

(52) U.S. Cl.
CPC ......... *G01R 31/2621* (2013.01); *G01R 15/04* (2013.01); *G01R 19/0023* (2013.01); *G01R 19/25* (2013.01)

(58) Field of Classification Search
CPC .......... H02H 3/08; H02H 1/0007; H02H 3/16; H02H 3/20; H02H 3/006; H02H 3/00;
(Continued)

(56) References Cited

U.S. PATENT DOCUMENTS

| | | | |
|---|---|---|---|
| 4,893,158 A | 1/1990 | Mihara et al. | |
| 7,702,302 B1 | 4/2010 | Stineman, Jr. | |

(Continued)

FOREIGN PATENT DOCUMENTS

| | | |
|---|---|---|
| DE | 38 21 065 A1 | 1/1989 |
| DE | 10 2015 121 194 A1 | 6/2017 |

(Continued)

OTHER PUBLICATIONS

Search Report issued in DE 10 2023 116 488.0, to which this application claims priority, mailed May 6, 2024 (English-language machine translation attached).

(Continued)

*Primary Examiner* — Vinh P Nguyen
(74) *Attorney, Agent, or Firm* — Tautz & Schuhmacher LLC; Michael McCandlish; Georg Hasselmann

(57) ABSTRACT

A device monitors a turn-off capability of an electrical load connected to a first current path connected to an external power supply. The first current path includes a first electrical actuating element, the operating state of the first actuating element being characterized by a first electrical quantity, which is a first capacitance resulting in a first voltage. The device includes a second current path including a second actuating element, the operating state of the second actuating element being characterized by a second capacitance resulting in a second voltage. The first capacitance and the second capacitance are connected in series. A control device drives the second actuating element and evaluates values of the first electrical quantity for recognition of a malfunction for the turning-off of the first actuating element. The process includes comparing the values of the first electrical quantity with a preset reference value.

12 Claims, 3 Drawing Sheets

(51) Int. Cl.
*G01R 19/00* (2006.01)
*G01R 31/26* (2020.01)

(58) Field of Classification Search
CPC .......... H02H 3/38; H02H 3/023; H02H 3/207;
H02H 3/105; H02H 9/04; H02H 3/24;
H02H 3/12; H02H 9/043; H02H 3/32;
G01R 31/2621; G01R 15/04; G01R
19/0023; G01R 19/25
See application file for complete search history.

(56) References Cited

U.S. PATENT DOCUMENTS

| | | | | |
|---|---|---|---|---|
| 8,299,820 | B2 * | 10/2012 | Deboy | ................. H03K 17/166 |
| | | | | 327/170 |
| 10,895,601 | B2 * | 1/2021 | Bogus | ................ H03K 17/0826 |
| 11,545,969 | B1 | 1/2023 | Murtaza et al. | |
| 11,754,627 | B2 * | 9/2023 | Vom Stein | ......... G01R 31/3275 |
| | | | | 324/424 |
| 2012/0161817 | A1 | 6/2012 | Kanayama | |
| 2017/0163255 | A1 | 6/2017 | Graf | |
| 2019/0056448 | A1 | 2/2019 | Asam | |
| 2019/0089343 | A1 | 3/2019 | Brugger et al. | |
| 2020/0393512 | A1 | 12/2020 | Vom Stein | |
| 2022/0404396 | A1 | 12/2022 | Frese | |

FOREIGN PATENT DOCUMENTS

| | | |
|---|---|---|
| DE | 10 2018 122 943 A1 | 3/2019 |
| DE | 10 2020 113 822 A1 | 12/2020 |
| DE | 10 2021 206 219 A1 | 12/2022 |
| DE | 102022118881 A1 | 3/2023 |
| EP | 1 335 471 A2 | 8/2003 |

OTHER PUBLICATIONS

European Search Report issued in EP 241830306, which is a counterpart hereof, mailed Oct. 10, 2024 and English machine translation thereof.

* cited by examiner

DEVICE AND METHOD FOR MONITORING A TURN-OFF CAPABILITY

CROSS REFERENCE TO RELATED APPLICATIONS

This application claims priority to German patent application 10 2023 116 488.0 filed on Jun. 22, 2023, which is hereby incorporated by reference in its entirety.

TECHNICAL FIELD

The present disclosure relates to a device for monitoring a turn-off capability of a load, optionally by a switching element. The disclosure also relates to methods for monitoring a turn-off capability, and to a control device, a system and a computer program.

BACKGROUND

A typical challenge in the case of such devices can be that of being able to diagnose the turn-off capability of a digital output when in the turned-on state, in particular when there is a load connected.

In the domain of functional safety, for example as per the SIL standard IEC 61508 and the performance level according to IEC 13849, a very high-probability safety function must be provided according to its specification in order to protect against injury to third parties, irreversible damage and accidents resulting in death. It must be possible to ensure with a very high degree of probability that secure digital outputs have a turn-off capability.

Methods and procedures for diagnosing a turn-off capability are known from the prior art. There may be provisions to perform a turn-off cyclically, for example in a time range of from 1 ms to every 500 ms. In practical applications the cyclical turn-off can be disruptive to the function of the switching elements. In this respect, it may be necessary to diagnose the turn-off capability and ensure it with a high degree of probability without the necessity of performing a turn-off.

Various methods are proposed in the prior art. DE 10 2020 113 822 A1 discloses a secure output in which the output switching elements do not have to be turned off cyclically for testing, as they are in a closed-loop control circuit by which their functional capability can be monitored. A substantial disadvantage of this solution is that the output switching element cannot be fully turned on when it is in a closed-loop control circuit, and there is a higher voltage across the semiconductor path than would be across it in a fully turned-on state. This can cause unnecessary heating of the switching element. Moreover, the closed-loop control circuit is elaborate and requires a large number of components, which in turn can result in a larger circuit board and further costs.

US 007 702 302 B1 discloses a circuit configuration that has a FET and a measuring resistor, for measuring current, in the power supply. A disadvantage of US 007 702 302 B1 is that a cyclic test of the FET cannot be performed when it is in the switched-on state, and therefore a high level of safety cannot be achieved. Moreover, the measuring resistors are connected in the power path, which can result in power losses.

US 2012/0161817 A1 describes a circuit for supplying a coil of a relay with electrical power. The current required for this may be provided by a battery. Two mutually parallel supply lines are provided, in each of which a field-effect transistor is provided as a switch. To energize the coil, the gate voltages of the field-effect transistors are brought synchronously to a value at which current flows through both field-effect transistors. The gate voltage is lowered slightly at regular intervals, and the voltage drop between the drain and source is measured. The measured values are analyzed for a wire break in the supply line to the field-effect transistor. A disadvantage can be that the junction capacitance is not measured, but instead the FET is only driven cyclically with a lower voltage. In addition, the load voltage has to be measured. A measuring system with high failure safety is not indicated.

EP 133 5471 A2 and DE 382 1065 disclose a protective circuit using a "monitor" transistor. The main transistor is turned off if the voltage across it is too high. A disadvantage of this can be that the main transistor is only protected if the voltage across it is too high, but not if it has incorrectly become low-impedance, and therefore no longer has turn-off capability.

In the cases presented, it may not be possible to diagnose a turn-off capability of a digital output when it is in the turned-on state. One object of the present disclosure can be to provide a device and a method that are each suitable for diagnosing the turn-off capability of a digital output when it is in the turned-on state.

SUMMARY

A device for monitoring a turn-off capability of an electrical load connected to a first current path having an electrical power supply is provided. Provided in the first current path there is a first electrical actuating element, the current conducting capacity of which can be altered by means of a first actuating signal. The operating state of the first actuating element is characterized by a first electrical quantity, which is a first capacitance at the first actuating element, and results in a first voltage, which is ascertained by a voltage measuring means. The device provides, in a second current path having a further electrical power supply, a second actuating element, for providing the first actuating signal, the current conducting capacity of which can be altered by means of a second actuating signal. The operating state of the second actuating element is characterized by a second electrical quantity, which is a second capacitance at the second actuating element, and results in a second voltage.

The first capacitance and the second capacitance are connected in series. Furthermore, a control device is provided, which is designed to drive the second actuating element by means of the second actuating signal, at least at mutually spaced measurement intervals, and to evaluate thereby obtained values of the first electrical quantity for recognition of a malfunction for the turning-off of the first actuating element, and the process of evaluation including a comparison of the obtained values of the first electrical quantity with at least one preset reference value.

For the purposes of the present disclosure, capacitance may be understood to be an electrical quantity that is able to store an electrical charge and build up a capacitance. A capacitance may be built up by application of a voltage.

For the purposes of the present disclosure, turn-off capability may be understood to be the capability of an actuating element, for example a field-effect transistor (FET), in which a current flow between source and drain can be interrupted completely when a suitable control voltage is applied to the gate. The turn-off capability may occur when the voltage at the gate is set such that the electric field in the channel is strong enough to completely block the current flow. In this state, the FET is considered to be "off" and only a very small leakage current flows between the source and drain. The ratio between the leakage current in the off state and the maximum current in the on state may be referred to as the turn-off ratio or turn-off current ratio.

For the purposes of the present disclosure, an electrical load may represent devices or components in an electrical system that take up electrical energy, which they use or convert to another form of energy.

For the purposes of the present disclosure, current conducting capacity in the case of a field-effect transistor may relate to the capability of the transistor to conduct an electrical current between the source terminal and the drain terminal when an appropriate control voltage is applied to the gate.

The device described above offers a number of advantages. Inter alia, by means of the disclosed device it is possible to identify when the voltage of the junction capacitance is below a predefined threshold, such that the actuating element (field-effect transistor) is not capable of being turned off further, and thus it can no longer be ensured that the digital output and/or an electrical load are de-energized. Further protective measures can therefore be taken. It may be provided that a second turn-off is activated and the digital output and/or an electrical load are de-energized. Additionally, in the case of a switching element it can be identified that turning off is no longer guaranteed, and an error message can be output in order to avoid/prevent reactivation.

It may be provided that there is a capacitor provided in the device. The capacitor may be coupled in parallel to the second actuating element in order to increase the capacitance of the second actuating element. A capacitance, optionally the junction capacitance, may be measured/ascertained by a capacitive voltage divider. For this purpose, the further capacitor is connected in series with the capacitance of the first actuating element (capacitance G-S path) that is to be measured. The second actuating element can turn on the capacitor. When the second actuating element is in the switched state, the capacitor is bridged. In the non-switched state (blocked state), the capacitor is switched, and a voltage drops. Alternatively, it may be provided that the second actuating element has a drain-source capacitance that is dimensioned in such a way that it fulfils the function of the capacitor. If the dimensioning of the drain-source capacitance is too small and/or if a larger design of the second actuating element is necessary to achieve a corresponding capacitance, a further capacitor, which may have a correspondingly greater capacitance, may be connected in parallel with the second actuating element.

It may be provided that the second capacitance, or the second capacitance connected in parallel with the capacitor, and the first capacitance behavior have the same capacitance order of magnitude, and the capacitance order of magnitude being in a range of from at least 100 pF to at most 10 nF. Thus, the corresponding voltage divider and a corresponding voltage drop can be achieved in order to still switch the first actuating element, but at the same time ascertain a gate-source voltage.

It may be provided that the first actuating element and the second actuating element is a transistor, and the actuating signal is a control current or a control voltage, it being provided that the transistor is an n-channel or a p-channel field-effect transistor.

It may be provided that the voltage measuring means is realized as an operational amplifier. By means of the operational amplifier, the value ascertained for the gate-source voltage can be compared with a reference value. The difference can be evaluated accordingly and consequently attributed to the turn-off behavior or an error in the turn-off behavior. The difference may be further transmitted to the control device and processed by it.

It may be provided that the voltage measuring means is realized as an analog-digital converter and provides a digital signal to the control device in dependence on the value for the first electrical quantity. By means of the analog-to-digital converter, the value for the first electrical quantity, obtained as an analog voltage signal, can be converted into a digital signal. The converted digital signal can be transmitted to the control device for further processing.

It may be provided that the control device compares the value for the first electrical quantity with at least one first and/or second preset reference value, and the preset reference value(s) being provided by means of a resistor voltage divider. The preset reference values may be set by means of resistors such that they represent the limits of a voltage value at which the first actuating element is still technically capable of being turned off. If the first actuating element can no longer be turned off, for example because it has broken down, the value obtained for the first electrical quantity is outside the value range provided by the resistor voltage divider.

It may be provided that, in order to recognize that there is no malfunction for the turning-off of the first actuating element, the first electrical quantity is reduced by a factor starting from a maximum value, such that the first actuating element is not yet turned off or, if it is turned off, remains turned off, and that there flows through the load a current that is sufficient for executing its function. It can be identified that the junction capacitance is regular when a reduced voltage that is sufficient to switch-through the first actuating element is applied. The first actuating element is therefore still considered to be capable of being turned off. The method for monitoring the turn-off capability is terminated once a measuring pulse has been sent, and the initial state of the device is restored and the circuit operates in normal mode, for example for switching the electrical load.

It may be provided that there is a third actuating element provided in the first current path, and the third actuating element is connected in series with the first switching element. If the junction capacitance drops due to breakdown and thus the falling voltage also drops below a preset reference value, it is concluded that the first actuating element is no longer capable of being turned off and the corresponding functions in the device are no longer fulfilled in accordance with the standard, in which case the digital output, or the electrical load, may be turned off via an alternative turn-off path. This alternative turn-off path is provided by means of the third actuating element. An error message may also be provided via the control device by means of a signal lamp, indication on a display, or message transmitted to another device, in order to warn an operator/user.

It may be provided that, in order to recognize a malfunction for the turning-off of the first actuating element, the first electrical quantity is reduced by a factor starting from a maximum value to such an extent that the first actuating element is no longer turned off, and the current sufficient for executing the function of the load is prevented by means of the third actuating element. In this way, the device can be switched to a safe state, and the digital output, or the electrical load, is de-energized, such that there is no harm to third parties.

It may be provided that the device also has a resistance element, and the resistance element is connected in parallel with the first capacitance of the first actuating element. The device is configured in such a way that the digital output is turned off if there is no second control signal present at the second actuating element. The through-switching energy is thus only provided for the duration of a short test pulse. For this purpose, the resistance element may be provided, which may be dimensioned in such a way that any error at the second actuating element cannot result in the first actuating element not turning off within a predefined process-safety time period.

That which is described above can be summarized in other words and in relation to a possible more specific design of the disclosure as described below, the following description to be construed as not limiting the disclosure.

The turn-off capability of a digital output is to be diagnosed in the turned-on state by measurement of the junction capacitance of the turned-off field-effect transistor.

A field-effect transistor may be constructed in such a way that a substrate is doped, thereby creating N regions and P regions. For example, an enhancement-type N-channel FET (field-effect transistor) may be contacted with D (drain) and S (source) in the N regions. It may have an insulation layer in the P region, such that the G (gate) terminal connection is non-conductive. The depletion layer is located in this region. When a voltage is applied at G relative to S, a capacitive charge occurs, which causes the depletion layer between D and S to become conductive.

This structure means that an FET has a junction capacitance that can be measured between G and S. The capacitance can also be measured in the switched-on state, in which the depletion layer is charged with voltage.

A FET can have two main fault states between D and S:
On the one hand, it may become permanently high-impedance. In this case, it cannot be turned on by application of the voltage at G relative to S. If the turned-off state is the safe state, then the FET has failed in the failsafe direction. On the other hand, the FET may also become permanently low-impedance. In this case, the blocking-state region has "broken down". The FET is then no longer capable of being turned off. In the broken-down state, the FET no longer has the same junction capacitance. It is reduced because the part of the blocking-state region that is conductive has the potential of the S pole of the junction capacitance. The capacitance between G and S is thus substantially reduced. The dielectric must have a region in which charge carriers are enriched, and thus also a region in which charge carriers are depleted. The breakdown occurs in the most direct connection between the doped regions, which corresponds to the enrichment region. It can therefore be assumed that the remaining junction capacitance is less than 50% of the previous one.

A capacitance may be measured by a capacitive voltage divider. For this purpose, a further capacitance is connected in series with the capacitance to be measured. This capacitor may be turned on by a further FET. The FET itself has a drain-source capacitance, which may be dimensioned in such a way that it in itself is sufficient for this purpose. Alternatively, an additional capacitor may be turned on.

The junction capacitance and the series capacitance may be dimensioned so that they are in the same order of magnitude, for example in the range of between 100 pF and 10 nF. If the further FET is connected with high impedance, the charge quantity of the junction capacitance divides to the capacitive divider. The divided voltage should be dimensioned so that the junction capacitance is sufficiently charged to further turn on the FET. The divided voltage may be sampled for a range within which it must lie.

If the FET has broken down, the voltage is outside the valid range. This may indicate that the FET is no longer capable of being turned off. To measure the voltages on a capacitive voltage divider, operational amplifiers may be provided that compare the voltages provided by a resistor voltage divider with a reference voltage.

Alternatively, the voltage may be sensed using other measurement methods, for example using an analog-to-digital converter element of a microcontroller.

The application can have a further turn-off path, for example another FET that is connected in series with the FET described above. Thus, if it is identified in testing that the FET is no longer capable of being turned off, i.e. it has broken down, then turning off is triggered via the redundant turn-off path.

The application has a drive control, for example a gate driver or a digital output of a microcontroller at D of the further FET. The diagnostic circuit configuration is designed so that the output is turned off if there is no voltage present at D of the further FET. The through-switching energy is thus provided only for the duration of a short test pulse.

For this purpose, a resistor may be provided that is dimensioned in such a way that any fault in the further FET cannot result in the FET not turning off within a predefined process safety time period. The circuit configuration is designed in such a way that no single fault can result in the loss of the safety function, and a very high level of diagnostic coverage is provided. During the test, the FET is briefly not fully turned on. This results in an increased voltage drop (D-S path), and thus in heating. An advantageously designed FET may be over-dimensioned, such that it can withstand a greater power than would be necessary for the rated current if it were permanently fully switched-through.

The following method may be used to check the switching capability of the output FET.

An initial state is that in which voltage is applied to the further FET D, a voltage is applied to G, the further FET is switched-through (D-S path), voltage is applied to the FET G, FET D is supplied with voltage, the FET is switched-through (D-S path).

A test pulse is applied to the further FET G, causing the G-S voltage to go to zero and the further FET to become high-impedance. The measuring capacitor and the blocking capacitance of the further FET form a capacitive voltage divider with the charged junction capacitance of the FET. As a result, the FET is discharged according to the capacitive ratio and the resulting voltage remains at the FET G.

The voltage at the FET G may be measured if the junction capacitance is regular. A reduced voltage is then present, but this is still sufficient for the FET to switch-through. If the junction capacitance is significantly reduced due to breakdown, a significantly reduced voltage is present.

The evaluation of whether the voltage is below a defined threshold may be affected according to the following criteria. If the voltage is only slightly reduced, the FET is capable of being turned off further.

The test pulse ends, causing the initial state to be restored.

If the voltage is reduced to below the defined threshold, the FET is not capable of being turned off further. The output is turned off via a second turn-off path. An error message is output, and reactivation is prevented. If the gate voltage U_G is sensed by the FET with and without a test pulse, the following errors may be identified:

(1) A breakdown of the FET (D-S path low-impedance) results in a reduction in the capacitance C_GS and thus in an increase in the voltage U_G during the test pulse.
(2) A breakdown of the FET (D-G path or S-G path low-impedance) results in a gate closure and thus in a reduction (or increase) in the voltage. A breakdown or high impedance of the further FET (D-S path) results in a change in the capacitive voltage divider and thus in a reduction or increase in the voltage.

If a fault state is identified, turn-off is executed.

Alternatively, it may be provided, in a second variant, that the change in the drain-source voltage resulting from the capacitive discharge is measured. This may be performed, firstly, by means of a circuit configuration that measures only the AC voltage component or, secondly, by a bandpass filter if the voltage is turned off and on cyclically at a particular frequency. The voltages may also be sensed and measured by means of an analog-to-digital converter.

Additionally provided is a method for monitoring a turn-off capability of an electrical load connected to a first current path having an electrical power supply, there being provided in the first current path a first electrical actuating element, the current conducting capacity of which can be altered by means of a first actuating signal, the operating state of the first actuating element being characterized by a first electrical quantity, which is a first capacitance at the first actuating element, and results in a first voltage, which is ascertained by a voltage measuring means, the device providing, in a second current path having a further electrical power supply, a second actuating element, for providing the first actuating signal, the current conducting capacity of which can be altered by means of a second actuating signal, the operating state of the second actuating element being characterized by a second electrical quantity, which is a second capacitance at the second actuating element, and results in a second voltage, the first capacitance and the second capacitance being connected in series, and a control device (driving the second actuating element by means of the second actuating signal, at least at mutually spaced measurement intervals, and evaluating thereby obtained values of the first electrical quantity for recognition of a malfunction for the turning-off of the first actuating element, and the process of evaluation including a comparison of the obtained values of the first electrical quantity with a preset reference value Also provided is a control device for driving a device according to the disclosure, which is designed to execute the method according to the disclosure, having a processor unit that is designed to provide control signals in order to drive a second actuating element, at least at mutually spaced measurement intervals; an interface that is designed to provide control signals and to receive obtained values of a first electrical quantity of a first actuating element; and the processor unit being also designed to provide control signals in order to evaluate a recognition of a malfunction for turning off the first actuating element, and the process of evaluation including a comparison of the obtained values of the first electrical quantity with at least one preset reference value.

Also provided is a system comprising a first and a second device according to the disclosure, the first and the second device can be present in duplicate and arranged in such a way that the negative pole of the first (upper) device (100) is coupled to the positive pole of the (lower) device (100).

The disclosure also relates to a computer program. The designs of the method that are described above may also be realized as a computer program, in which case a control device (for example a computer, microcontroller, DSP, FPGA and/or PLC) is caused to perform the method according to the disclosure when the computer program is executed on a control device, or on a processor, of the control device. The computer program may be provided as a signal by download or stored in a memory unit of the control device with computer-readable program code contained therein, in order to cause a control device to execute instructions according to the above-mentioned method. The computer program may also be stored on a machine-readable memory medium.

The object is therefore alternatively achieved by a memory medium, optionally a computer-readable memory medium, that is designed to store the method according to the disclosure (as program code) and is readable by a computer or by a processor of the computer. The program code, upon being executed by a processor circuit of a computer or a computer network, causes an example of the method according to the disclosure to be executed.

The memory medium may be provided, for example, at least partially, as a non-volatile data memory (for example as a flash memory and/or as an SSD—solid-state drive) and/or at least partially as a volatile data memory (for example as a RAM-random-access memory). The memory medium may be arranged in the processor circuit in its data memory. However, the memory medium may also be operated, for example, as a so-called app-store server on the Internet. A processor circuit comprising at least one microprocessor may be provided by the computer or computer network. The program code may be provided as binary code or an assembler and/or as source code of a programming language (for example C) and/or as a program script (for example Python).

The above designs and developments can be combined with one other as required, where appropriate. Further possible designs, developments and implementations of the disclosure also include combinations not explicitly mentioned above or below with respect to the features of the disclosure described in the developments. A person skilled in the art can also add individual aspects as improvements or additions to the respective basic form of the present disclosure. Features of the device claims may be implemented and/or executed by corresponding functions, according to which they supplement or extend the method. Method steps may also be implemented by corresponding implementation modules in the device. Thus, what is described above with reference to the device also applies analogously to the method and vice versa.

BRIEF DESCRIPTION OF THE DRAWINGS

The disclosure will now be explained with reference to the drawings.

In the drawings.

DESCRIPTION

Figure 1:
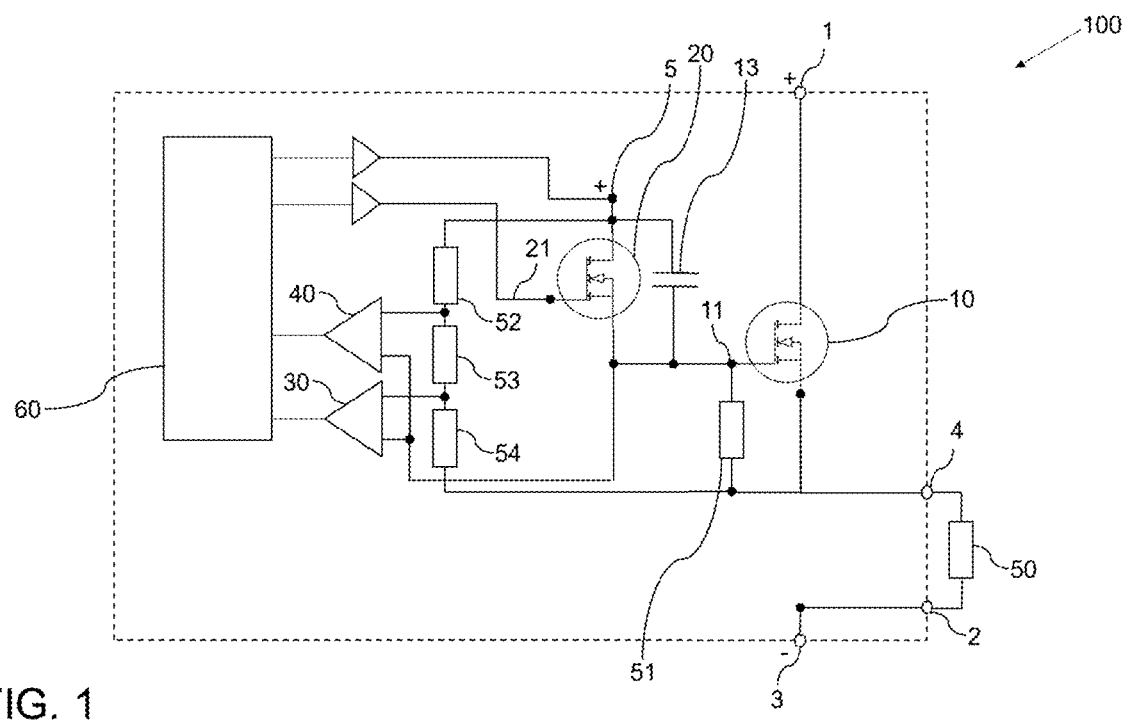
FIG. 1 shows a schematic representation or a device according to the disclosure.

Neither the drawings nor the descriptions thereof is in anyway intended to limit the scope of the disclosure and are provided for exemplary purposes only.

The accompanying drawings are intended to impart further understanding of the development of the disclosure. They illustrate developments and, in combination with the description, serve to explain principles and concepts of the disclosure. Other developments and many of the advantages mentioned are apparent by reference to the drawings. The elements of the drawings are not necessarily shown to scale with respect to each other.

In the FIGS. of the drawing, elements, features and components that are identical, have the same function and act in the same way are in each case—unless stated otherwise—to be denoted by the same reference designations.

With reference to FIG. 1, a first example of the device is explained. FIG. 1 shows a schematic representation of a device 100 according to the disclosure.

The device 100, optionally an electronic device, is provided for monitoring a turn-off capability of an electrical load 50 connected to a first current path that has an electrical power supply 1, 3. The electrical load 50 is coupled to the device 100 via the terminal connections 2, 4. The terminal connections 2, 4 represent an output, which can be switched via a first actuating element 10.

The first actuating element 10 is connected in the first current path and has an electrical connection to a voltage source. The first actuating element 10 may be realized as a field-effect transistor.

The current conducting capacity of the first actuating element 10 may be capable of being altered by means of a first actuating signal 11. The first actuating signal 11 may be a current or a voltage.

The operating state of the first actuating element 10 may be characterized by a first electrical quantity, which is a first capacitance $C_{GS10}$ at the first actuating element, and a first voltage $U_{GS10}$, which is ascertained by a voltage measuring device 30.

The voltage measuring device 30 may ascertain/measure the first voltage at the gate-source path $U_{GS10}$ of the first actuating element 10. The voltage measuring device 30 may be realized as an operational amplifier, which receives the voltage at an input.

Further designs of the voltage measuring device 30 may be provided, which ascertain and/or provide a value for the first voltage at the gate-source path $U_{GS10}$ of the first actuating element 10. The first actuating element 10 is coupled to the power supply 1 via the drain terminal. The first actuating element 10 is also coupled to the load 50 via the source terminal.

The device 100 has a second actuating element 20 in a second current path. The second actuating element 20 may be realized as a field-effect transistor.

The second current path has a further electrical power supply 5. The second actuating element 20 is designed to provide the first actuating signal 11 for driving the first actuating element 10. The first actuating signal 11 can be provided when the second actuating element 20 is in an enabled state.

The current conducting capacity of the second actuating element 20 may be capable of being altered by a second actuating signal 21. The second actuating signal 21 may be provided by a control device 60. The operating state of the second actuating element 20 may be characterized by a second electrical quantity, which is a second capacitance $C_{GS20}$ at the second actuating element 20 and results in a second voltage (gate-source voltage) $U_{GS20}$.

It is provided that the first capacitance and the second capacitance are connected in series.

A capacitive voltage divider can be configured from the first and second capacitance. Thus, in the example, the drain-source capacitance of the second actuating element 20 and the gate-source capacitance form a capacitive voltage divider.

Furthermore, a control device 60 is provided in the device 100. The control device 60 may be realized as a microcontroller, FPGA, computer, PLC or the like. Optionally, the control device 60 may be realized as a device having an interface 62 configured to receive signals/data and to provide signals/data.

The control device 60 can be configured to drive the second actuating element 20 by means of the second actuating signal 21, at least at mutually spaced measurement intervals.

As a result of measuring pulses being provided as the second actuating signal 21, the second actuating element 20 can be enabled or, in the absence of the actuating signal 21, it is switched to a high-impedance state. When the second actuating element 20 is switched to high impedance, the charge quantity of the junction capacitance of the first actuating element 10 divides to the capacitive divider.

The divided voltage may be sampled by the first voltage measuring device 30 and evaluated as to whether it is still within the range predefined for confirming fault-free turn off. In the event that the first actuating element 10 is broken down, the voltage may lie outside a valid range. This may indicate that the first actuating element 10 is no longer capable of being turned off. Thus, the obtained values of the first electrical quantity may be evaluated for recognition of a malfunction for turning off the first actuating element 10.

The process of evaluation of the obtained values of the first electrical quantity includes a comparison with at least one preset reference value.

The preset reference value(s) may be provided via a resistor voltage divider 52, 53, 54. The resistor voltage divider 52, 53, 54 is supplied with a voltage 5. The resistor values may be selected to provide reference preset values that can ensure the limits for the turn-off capability of the first actuating element 10.

A first and a second voltage measuring device 30, 40 may receive a preset reference value of the resistor voltage divider 52, 53, 54. Also, the first and second voltage measuring devices 30, 40 are coupled to the gate terminal of the second actuating element 20 and to the source terminal of the first actuating element 10 in order to receive the first electrical quantity.

A measurement may be performed by a comparison of the first electrical quantity, comprising the gate-source voltage of the first actuating element 10 and the drain-source voltage of the second actuating element 20, with a preset reference value.

Two capacitive paths are compared with each other by measurement of the voltage drop. If the capacitance of the gate-source path is less than the capacitance of the drain-source path, then the gate-source voltage is greater than the drain-source voltage, and the first actuating element 10 should remain turned on.

The device according to the disclosure can protect against two cases of breakdown that cause a malfunction of the turn-off capability.

A breakdown of the first actuating element 10 can result in a reduction in the junction capacitance, which through the capacitance voltage divider results in an increase in the voltage. A maximum preset reference value may be provided for the value of the increase.

A breakdown of the first actuating element 10 can result in a gate closure and a reduction in the voltage. A maximum preset reference value may be provided for the value of the reduction.

As an alternative to the operational amplifier, an analog-to-digital converter may be provided.

Figure 5:
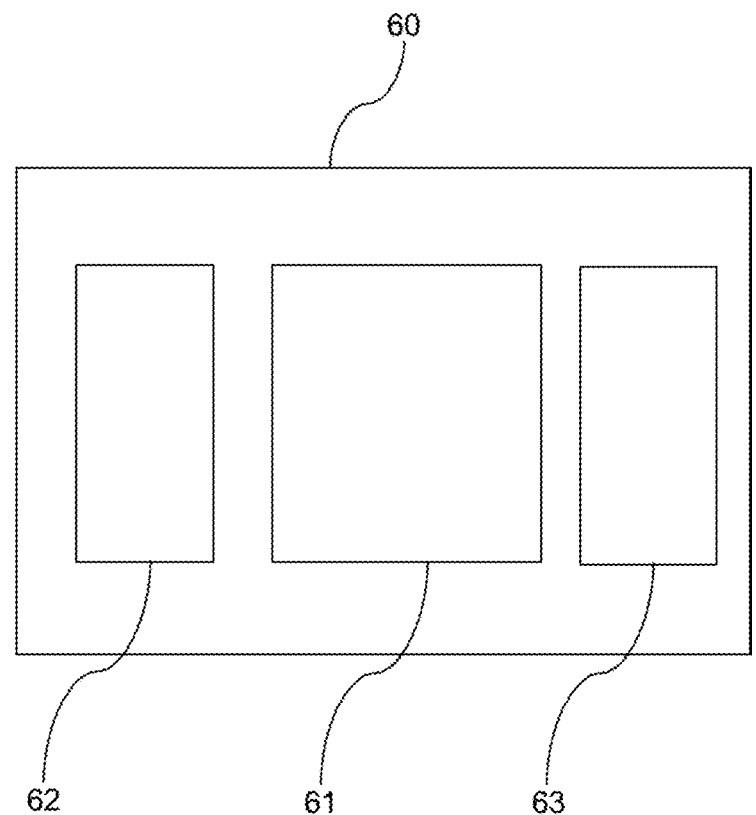
FIG. 5 shows a schematic representation of a control device according to the disclosure.

The analog-to-digital converter may convert the sensed first electrical quantity into a digital signal and provide it to the control device 60, represented in FIG. 5, via the interface 62.

Optionally, the control device 60 has a processor unit 61.

The processor unit 61 is designed to provide control signals in order to drive a second actuating element 20, at least at mutually spaced measurement intervals. The interface 62 is designed to provide control signals and to receive the obtained values of a first electrical quantity of the first actuating element 10.

Additionally, the processor unit 61 is further designed to provide control signals to evaluate a recognition of a malfunction for the turning-off of the first actuating element 10, and the process of evaluation including a comparison of the obtained values of the first electrical quantity with at least one preset reference value.

The control device 60 may have a memory unit 63 in which the corresponding preset reference values are stored.

The processor unit 61 of the control device 60 may compare the digital signals of the analog-digital converter element with the stored preset reference values and signal the recognition of a malfunction for the turning-off of the first actuating element 10. The control device 60 may provide a signal that is transmitted to further devices for the purpose of outputting a warning.

The control device 60 may also drive further devices for the purpose of triggering a warning.

In one example, with reference to FIG. 1, it may be provided that a further capacitor 13 is connected in series with the capacitance of the first actuating element 10 (junction capacitance) to be measured. In this way, the drain-source capacitance, and thus the second actuating element 20, may be designed to be smaller.

The further capacitor 13 may be switched by the second actuating element 20. The capacitor 13 is selected such that in a capacitive voltage divider there is still a corresponding voltage present at the first actuating element 10, so that it is enabled.

The junction capacitance (gate-source) of the first actuating element 10 and the further capacitor 13 may be dimensioned so that they are in the same order of magnitude, for example in the range of between 100 pF and 10 nF.

If the second actuating element 20 is switched to high impedance, the charge quantity of the junction capacitance of the first actuating element 10 is divided to the capacitive divider consisting of the further capacitor 13 (alternatively the capacitance of the drain-source path of the second actuating element 20). The divided voltage should be dimensioned such that the junction capacitance is sufficiently charged to further turn on the first actuating element 10.

The divided voltage may be scanned for a range within which it must lie.

If the first actuating element 10 has broken down, then the voltage is outside the valid range. This may mean that the first actuating element 10 is no longer capable of being turned off.

The device 10 is designed so that the output is turned off if there is no voltage present at the drain terminal of the second actuating element 20. The through-switching energy is provided for the duration of a short test pulse. For this purpose, a resistor 51 may be provided, which is dimensioned such that any fault in the second actuating element 20 cannot result in the first actuating element 10 not turning off within a predefined process safety time period.

In an alternative design, it may be provided that the change in the drain-source voltage resulting from the capacitive discharge is measured. This may be done, on the one hand, by means of a circuit configuration that measures only the AC voltage component or, on the other hand, by a bandpass filter if the voltage is turned off and on cyclically at a particular frequency. The voltages may also be sensed and measured by means of an analog-to-digital converter. In this respect, the junction capacitance may be ascertained by use of a different/further measurement principle.

It may be provided to determine the capacitance on the discharge curve, instead of by means of a capacitive voltage divider. If it is found that the capacitance $C_{DS20}$ represented in FIG. 1 is very small compared to the junction capacitance to be measured, i.e. can be disregarded as a first approximation, and the capacitor 13 is not provided, but the resistor 51 is suitably dimensioned, then the junction capacitance can be ascertained on the basis of the discharge time. A test pulse may be started, and the time that elapses until the voltage falls below a reference value may be measured.

Figure 3:
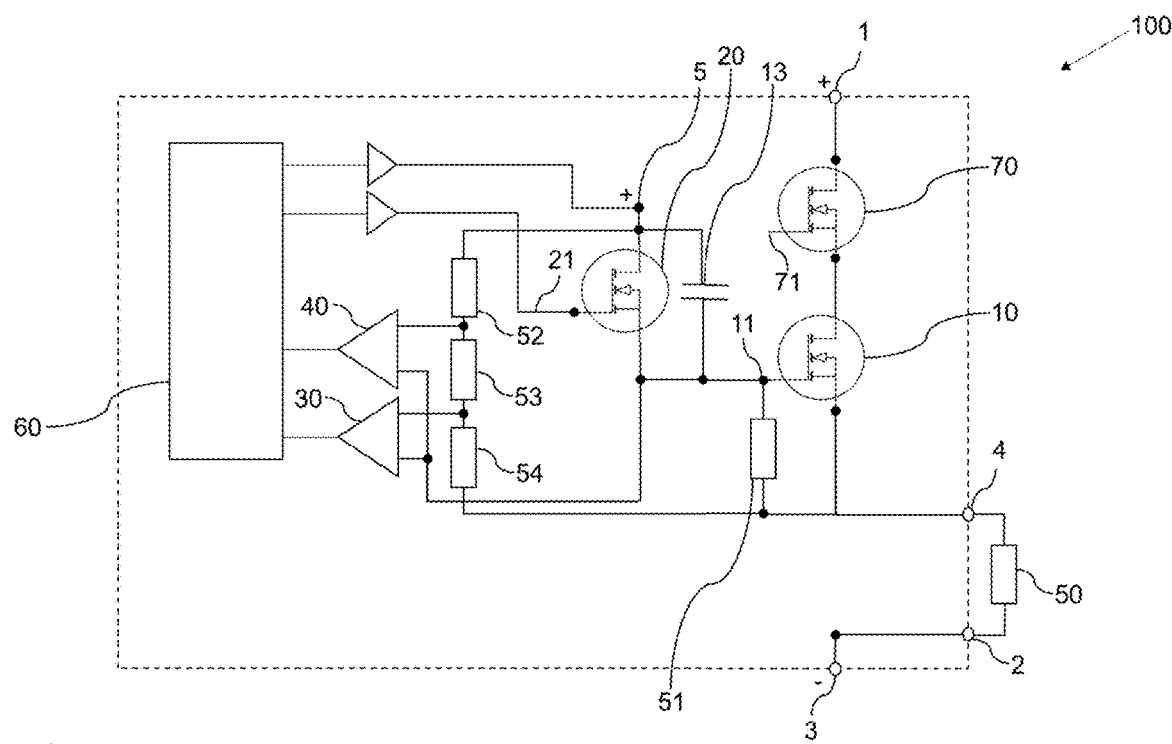
FIG. 3 shows a further schematic representation of a device according to the disclosure.

In an alternative/supplementary design, the device 100 as shown in FIG. 3 has a third actuating element 70.

The third actuating element 70 is connected in series with the first actuating element 10 in the first current path. If it is evaluated that the voltage has decreased to below a predefined preset reference value, the first actuating element 10 is no longer capable of being turned off.

The output 4, 2 and/or the electrical load 50 is/are turned off via a second switch-off path that comprises the third actuating element 70. An error message is output, and reactivation is prevented. The third actuating element 70 may be driven via the control device 60.

Figure 2:
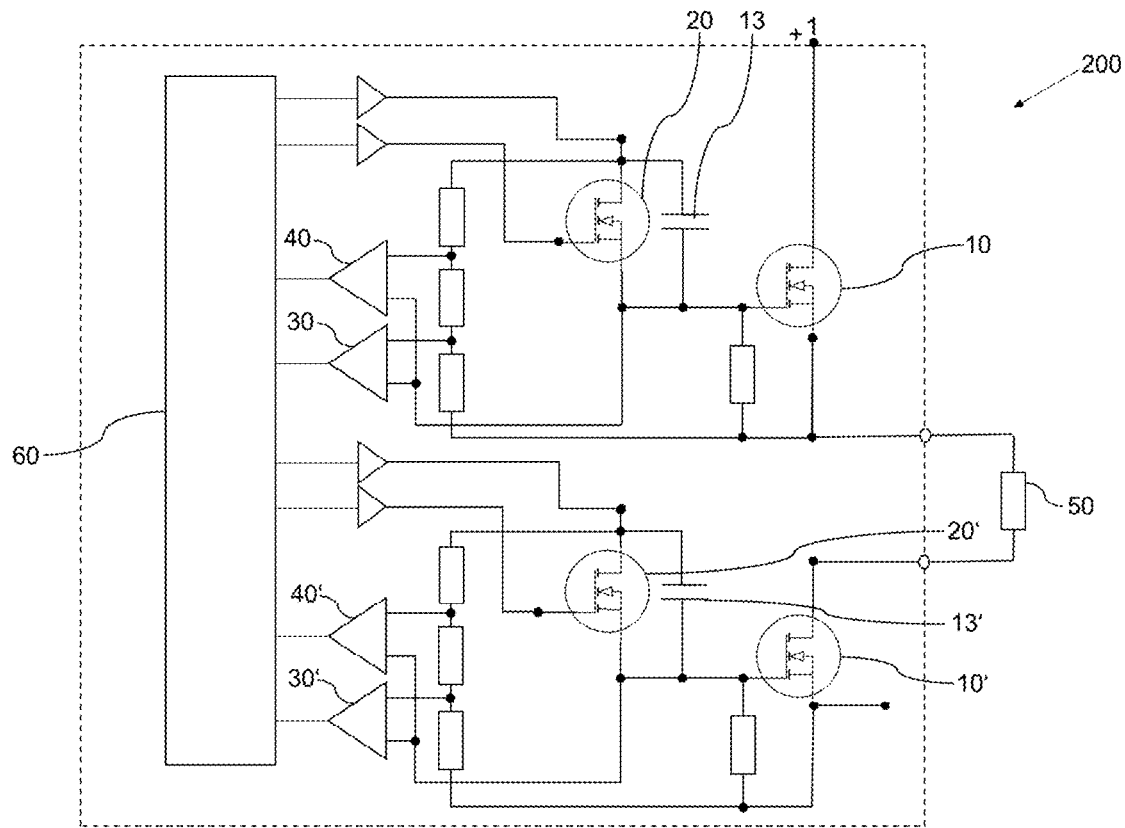
FIG. 2 shows a schematic representation of a system according to the disclosure.

With reference to FIG. 2, a further design of the device is explained. This is based on the first example of the device explained above with reference to FIG. 1; elements that are identical or that act in the same way are denoted by the same reference designations and are not described again in detail. The system 200 according to the disclosure can be seen from FIG. 2.

The system 200 has a first and a second device 100 according to the disclosure. The first and second devices 100 are present in duplicate and are arranged in such a way that the negative pole of the first (upper) device 100 is coupled to the positive pole of the (lower) device 100. The system 200 also has an output 201 for tapping the voltage at the negative pole. The first device 100 and the second device are couple a load 50.

In the design of the system 200, a second switch-off channel is provided. Because of the two devices 100 for activating the positive and negative channels, a second switch-off channel remains outside the device even in the event of a cross-circuit. In the event of the load 50 on the positive channel being supplied from another source as a result of a fault, the second device 100 (as a negative switch) can still prevent the flow of current. In the event of there being an earth fault on the negative channel of the load 50, the first device 100 (as a positive switch) can still prevent the flow of current.

Figure 4:
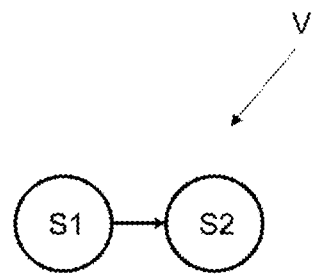
FIG. 4 shows a flow diagram of a method according to the disclosure.

FIG. 4 shows a flow diagram of a method according to the disclosure. In FIG. 4, the reference designation V denotes an example of the method according to the disclosure. The method V for monitoring a turn-off capability comprises a plurality of method steps. The method V may be executed by the processor unit 61 of the control device 60. In a first step S1, the second actuating element 20 is driven by means of the second actuating signal 21, at least at mutually spaced measurement intervals. In a second step S2, values of the first electrical quantity obtained in the process are evaluated for recognition of a malfunction for the turning-off of the first actuating element 10.

LIST OF REFERENCE DESIGNATIONS 1,3 electrical power supply
10 first actuating element
11 first actuating signal
13 capacitor
20 second actuating element
21 second actuating signal
30 voltage measuring means
40 voltage measuring means
50 load
51 resistance element
52,53,54 resistor voltage divider
60 control device
61 processor unit
62 interface
63 memory unit
70 third actuating element
71 third actuating signal
100 device
200 system
201 negative pole of the voltage supply
V method
S1-S2 method steps

What is claimed is:

1. A device for monitoring a turn-off capability of an electrical load comprising:
   a first current path designed to be connected to an external electrical power supply, the first current path including a first electrical actuating element, wherein a current conducting capacity of the first electrical actuating element can be altered by a first actuating signal, wherein an operating state of the first actuating element is characterized by a first electrical quantity, the first electrical quantity being a first capacitance at the first electrical actuating element, and resulting in a first voltage, the first voltage being ascertained by a voltage measuring device,
   a second current path including a second electrical power supply, and a second actuating element for providing the first electrical actuating signal, wherein a current conducting capacity of the second actuating element can be altered by a second actuating signal, an operating state of the second actuating element being characterized by a second electrical quantity, the second electrical quantity being a second capacitance at the second actuating element, and results in a second voltage, wherein the first capacitance and the second capacitance are connected in series, and
   a control device, the control device being designed to drive the second actuating element by the second actuating signal at least at mutually spaced measurement intervals, and to evaluate thereby obtained values of the first electrical quantity for recognition of a malfunction for a turning-off of the first actuating element, wherein evaluating the obtained values of the first electrical quantity includes a comparison of the obtained values of the first electrical quantity with at least one preset reference value.

2. The device according to claim 1, the device further comprising a capacitor being coupled in parallel to the second actuating element to increase a total capacitance at the second actuating element.

3. The device according to claim 2, wherein the second capacitance, or the second capacitance connected in parallel with the capacitor, and a first capacitance behavior have a same capacitance order of magnitude.

4. The device according to claim 3, wherein the capacitance order of magnitude is in a range of from at least 100 pF to at most 10 nF.

5. The device according to claim 1, wherein each of the first actuating element and the second actuating element is a transistor, and each of the first actuating signal and the second actuating signal is a control current or a control voltage, and wherein the transistor for each of the first actuating element and the second actuating element is an n-channel or a p-channel field-effect transistor.

6. The device according to claim 1, wherein the voltage measuring device is an operational amplifier or an analog-to digital converter, and is designed to provide a digital signal to the control device in dependence on a value of the obtained values of the first electrical quantity.

7. The device according to claim 1, further comprising a resistor voltage divider, wherein the control device is designed to compare a value for the first electrical quantity with at least one first and/or second preset reference value, and the at least one first and/or second preset reference values are provided by the resistor voltage divider.

8. The device according to claim 1, wherein, in order to recognize that there is no malfunction for the turning-off of the first actuating element, the device is designed to reduce the first electrical quantity by a factor starting from a maximum value, such that the first actuating element is not yet turned off, or remains turned off, and that there flows through the load a current that is sufficient for executing a function of the load.

9. The device according to claim 1, further comprising a third actuating element provided in the first current path, the third actuating element being connected in series with the first actuating element; optionally, in order to recognize a malfunction for the turning-off of the first actuating element, the first electrical quantity being reduced by a factor starting from a maximum value to such an extent that the first actuating element is no longer turned off, and a current sufficient for executing a function of the load is prevented by the third actuating element.

10. The device according to claim 1, further comprising a resistance element, wherein the resistance element is connected in parallel with the first capacitance of the first actuating element.

11. A control device for monitoring a turn-off capability of an electrical load connected, in a device according to claim 1, via the first actuating element to the first current path connected to the electrical power supply, the control device comprising:
   a processor unit designed to provide control signals in order to drive the second actuating element, at least at mutually spaced measurement intervals; and
   an interface designed to provide control signals and to receive the obtained values of the first electrical quantity of the first actuating element;
   wherein the processor unit is also designed to provide control signals in order to evaluate a recognition of a malfunction for turning off the first actuating element, and the process of evaluation includes comparing the obtained values of the first electrical quantity with at least one preset reference value.

12. A method for monitoring a turn-off capability of an electrical load connected to a first current path connected to an electrical power supply, there being provided in the first current path a first electrical actuating element, the method comprising:
   altering a current conducting capacity of the first electrical actuating element by a first actuating signal, wherein an operating state of the first actuating element is characterized by a first electrical quantity, the first electrical quantity being a first capacitance at the first actuating element, resulting in a first voltage,
   ascertaining the first voltage by a voltage measuring device, wherein the device provides, in a second current path having a further electrical power supply, a second actuating element, for providing the first actuating signal, the current conducting capacity of which can be altered by means of a second actuating signal, the operating state of the second actuating element being characterized by a second electrical quantity, which is a second capacitance at the second actuating element, and results in a second voltage, the first capacitance and the second capacitance being connected in series, and a control device driving the second actuating element by means of the second actuating signal, at least at mutually spaced measurement intervals, and
   evaluating thereby obtained values of the first electrical quantity for recognition of a malfunction for a turning-off of the first actuating element, wherein evaluating the obtained values of the first electrical quantity includes comparing the obtained values of the first electrical quantity with a preset reference value.

* * * * *